United States Patent
Merry et al.

(10) Patent No.: US 11,996,307 B2
(45) Date of Patent: May 28, 2024

(54) SEMICONDUCTOR PROCESSING TOOL PLATFORM CONFIGURATION WITH REDUCED FOOTPRINT

(71) Applicant: Applied Materials, Inc., Santa Clara, CA (US)

(72) Inventors: Nir Merry, Mountain View, CA (US); Schubert S. Chu, San Francisco, CA (US); Sushant S. Koshti, Sunnyvale, CA (US); Michael C. Kuchar, Georgetown, TX (US); Nyi Oo Myo, San Jose, CA (US); Songjae Lee, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 468 days.

(21) Appl. No.: 17/317,566

(22) Filed: May 11, 2021

(65) Prior Publication Data

US 2022/0199436 A1    Jun. 23, 2022

Related U.S. Application Data

(60) Provisional application No. 63/199,398, filed on Dec. 23, 2020.

(51) Int. Cl.
*H01L 21/67* (2006.01)
*H01L 21/687* (2006.01)

(52) U.S. Cl.
CPC .. *H01L 21/67196* (2013.01); *H01L 21/67167* (2013.01); *H01L 21/68707* (2013.01); *H01L 21/67207* (2013.01)

(58) Field of Classification Search
None
See application file for complete search history.

(56) References Cited

U.S. PATENT DOCUMENTS

| 6,841,485 | B1 | 1/2005 | Inoue et al. |
| 10,665,476 | B2 * | 5/2020 | Quiles ............... H01L 21/67766 |

(Continued)

FOREIGN PATENT DOCUMENTS

| CN | 105463406 | 4/2016 |
| JP | 2003115518 A | 4/2003 |

(Continued)

OTHER PUBLICATIONS

Office Action for Japanese Patent Application No. JP20220540732, dated Oct. 3, 2023, 2 Pages.

(Continued)

*Primary Examiner* — Sylvia Macarthur
(74) *Attorney, Agent, or Firm* — Lowenstein Sandler LLP

(57) ABSTRACT

A substrate processing system includes a factory interface having a controlled environment and a transfer chamber. The transfer chamber includes four first facets and three second facets, where each of the three second facets has a width that is narrower than that of each of the four first facets. A first processing chamber is attached to one of the four first facets. A first auxiliary chamber is attached to a first of the three second facets, where the first auxiliary chamber is smaller than the first processing chamber. A load lock is attached to a second of the three second facets and to the factory interface. A robot is attached to a bottom of the transfer chamber, the robot adapted to transfer substrates to and from the first processing chamber, the first auxiliary chamber, and the load lock.

15 Claims, 10 Drawing Sheets

(56) References Cited

U.S. PATENT DOCUMENTS

| | | | |
|---|---|---|---|
| 11,177,183 B2* | 11/2021 | Liu | H01L 21/67253 |
| 11,756,840 B2* | 9/2023 | Liu | H01L 22/12 |
| | | | 156/345.1 |
| 2003/0110611 A1* | 6/2003 | Lappen | H01L 21/68 |
| | | | 29/464 |
| 2003/0131458 A1* | 7/2003 | Wang | H01L 21/67745 |
| | | | 29/25.01 |
| 2003/0213560 A1 | 11/2003 | Wang et al. | |
| 2007/0141748 A1 | 6/2007 | Rice | |
| 2007/0160447 A1 | 7/2007 | Amikura et al. | |
| 2014/0209024 A1* | 7/2014 | Kim | H01L 21/02046 |
| | | | 156/345.31 |
| 2014/0271055 A1* | 9/2014 | Weaver | H01L 21/6719 |
| | | | 901/29 |
| 2014/0374024 A1* | 12/2014 | Nguyen | H01J 37/32357 |
| | | | 156/345.31 |
| 2015/0030771 A1* | 1/2015 | Gelatos | C23C 16/54 |
| | | | 427/250 |
| 2015/0045961 A1 | 2/2015 | Koshti et al. | |
| 2019/0148131 A1 | 5/2019 | Dube et al. | |
| 2021/0175100 A1* | 6/2021 | Rice | H01L 21/67196 |
| 2022/0139740 A1* | 5/2022 | Decottignies | H01L 21/67167 |
| | | | 414/751.1 |
| 2022/0199436 A1* | 6/2022 | Merry | H01L 21/67196 |

FOREIGN PATENT DOCUMENTS

| | | |
|---|---|---|
| JP | 2017500755 A | 1/2017 |
| KR | 20130015223 A | 2/2013 |
| KR | 20200124314 A | 11/2020 |
| WO | 2020-066571 | 4/2020 |

OTHER PUBLICATIONS

International Search Report and Written Opinion for International Application No. PCT/US2021/063896, dated Apr. 12, 2022, 12 pages.

* cited by examiner

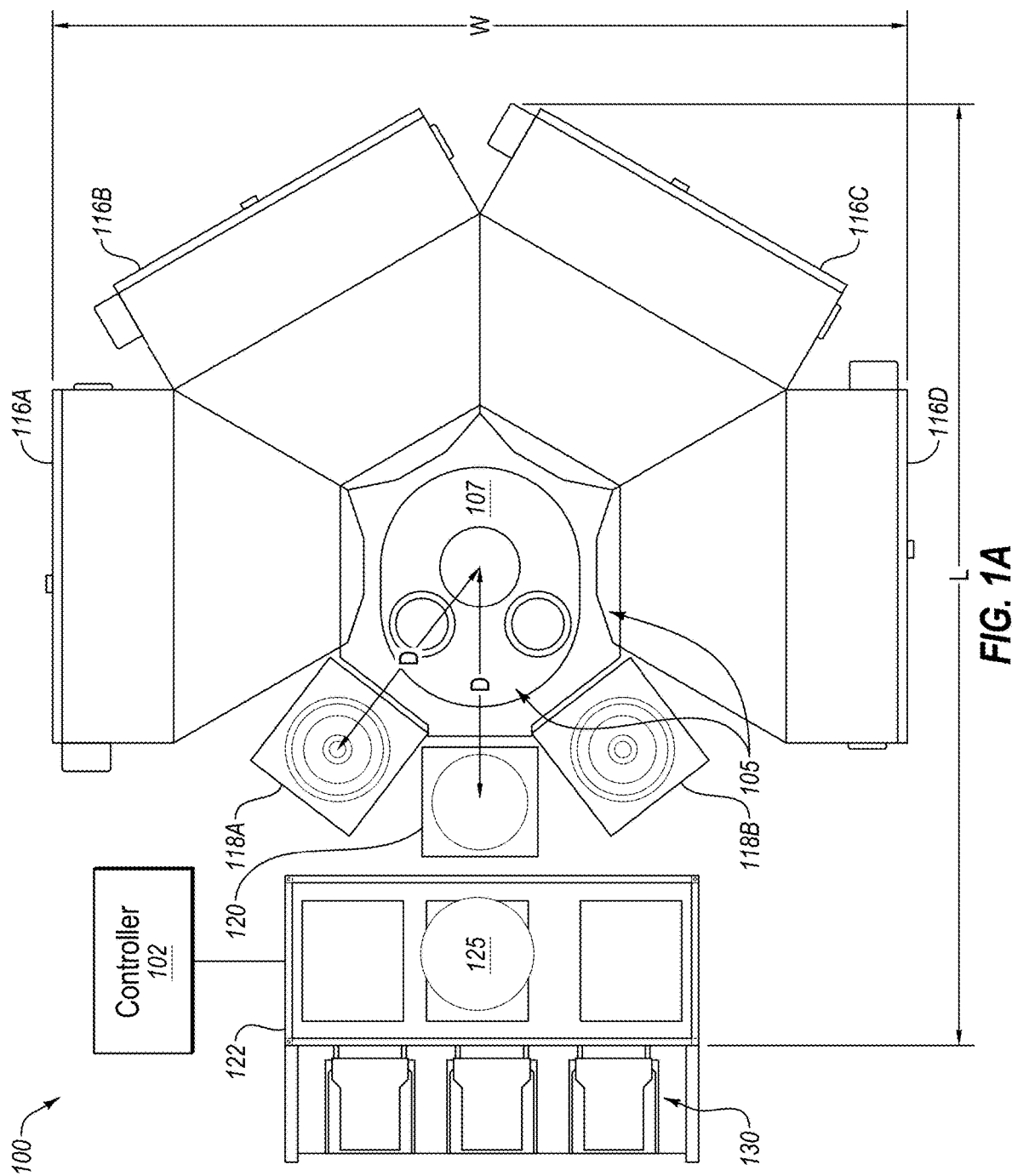

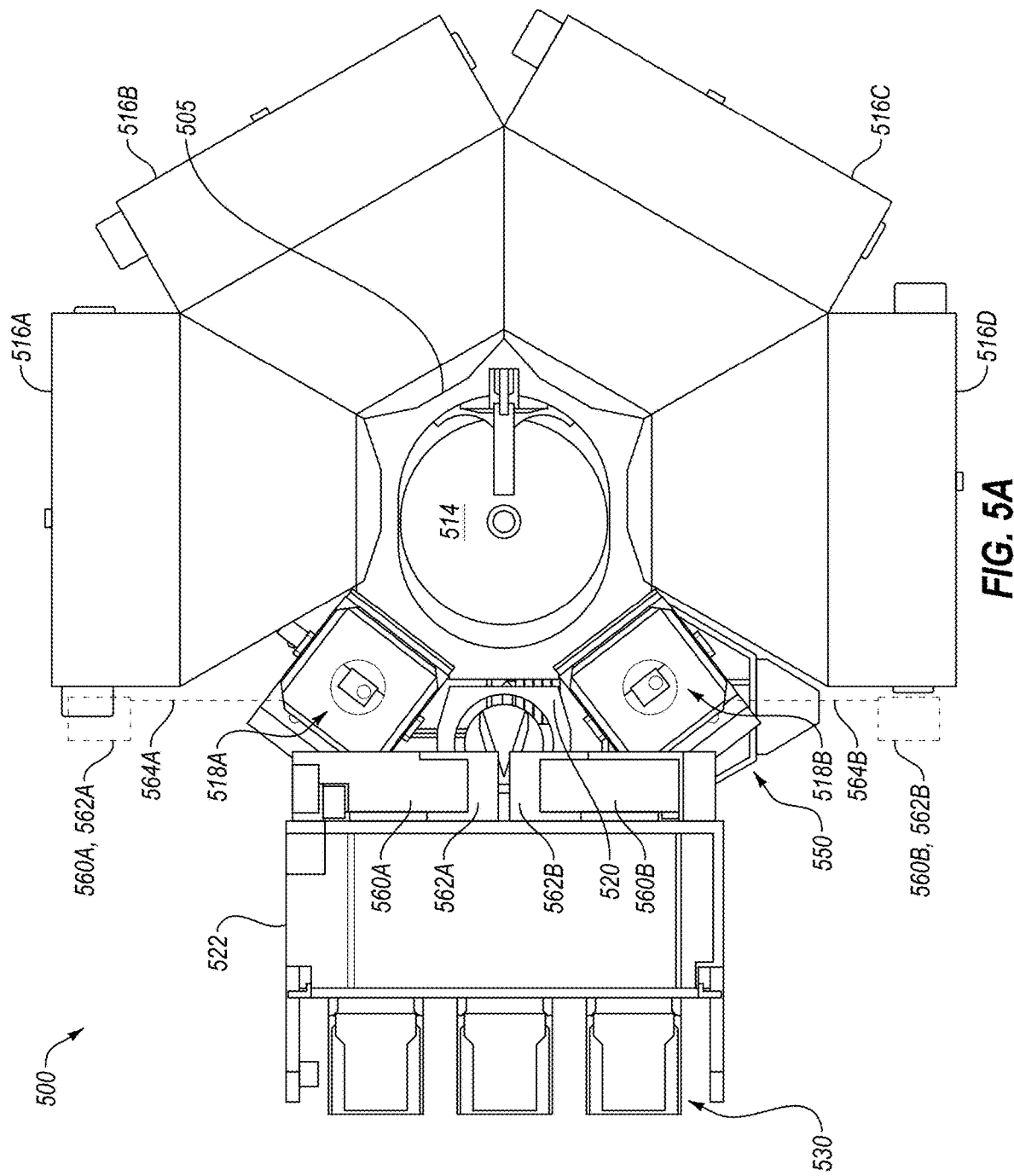

SEMICONDUCTOR PROCESSING TOOL PLATFORM CONFIGURATION WITH REDUCED FOOTPRINT

RELATED APPLICATIONS

The present application claims priority to U.S. Provisional Patent Application No. 63/199,398 filed Dec. 23, 2020, and entitled "SEMICONDUCTOR PROCESSING TOOL PLATFORM CONFIGURATION WITH REDUCED FOOTPRINT," which is herein incorporated by this reference in its entirety.

TECHNICAL FIELD

Embodiments of the present disclosure relate to a semiconductor processing tool platform configuration with reduced footprint.

BACKGROUND

Manufacturing of semiconductor devices involves performing a sequence of procedures with respect to a substrate or "wafer" such as a silicon substrate, a glass plate, and the like. These steps can include polishing, deposition, etching, photolithography, heat treatment, and so forth. Usually a number of different processing steps are performed in a single processing system or "tool" that includes multiple processing chambers. Some tools involve multiple transfer chambers due to a limited number of facets on each of the transfer chambers to which to attach the processing chambers usable to perform all of the steps within the same tool, e.g., that includes a similar processing environment such as pressure, temperature, clean air level, vacuum, etc. Including multiple processing chambers within the processing tool can increate wafer processing throughput.

Only by way of example, a currently-employed tool for epitaxial deposition (growth) of film layers includes two six-faceted transfer chambers that are connected by a via to facilitate passing substrates therebetween. A first of the transfer chambers is connected, via a load lock, to a front interface (using two of the facets), is attached to the via using two more of the facets, leaving two facets for attachment to two pre-clean chambers. The pre-clean chambers are employed to prepare the surface of the wafers for the epitaxial growth layer to be deposited within an epitaxial processing chamber. Thus, the first transfer chamber is employed for the pre-clean chambers while four facets of the second transfer chamber are attached to four epitaxial processing chambers, using the remainder two facets to connect to the via. In this way, two transfer chambers are combined in order to perform both the pre-clean and the epitaxial growth deposition within the same tool and maintaining four processing chamber capability. The footprint of this processing tool is quite large due to the use of both transfer chambers and the via, taking up valuable and increasingly more costly square footage of a fabrication facility.

SUMMARY

Some of the embodiments described herein cover a system that includes a substrate processing system, including a factory interface having a controlled environment and a transfer chamber. The transfer chamber includes four first facets and three second facets, where each of the three second facet has a width that is narrower than that of each of the four first facets. A first processing chamber is attached to one of the four first facets. A first auxiliary chamber is attached to a first of the three second facets, where the first auxiliary chamber is smaller than the first processing chamber. A load lock is attached to a second of the three second facets and to the factory interface. A robot is attached to a bottom of the transfer chamber, the robot adapted to transfer substrates to and from the first processing chamber, the first auxiliary chamber, and the load lock.

In related embodiments, described herein is a mainframe for a semiconductor manufacturing device, the mainframe including a transfer chamber. The transfer chamber includes a bottom and four first facets attached to the bottom, where each first facet is adapted for attachment to a processing chamber. Two second facets are attached to the bottom, where each of the two second facets has a width that is narrower than that of each of the four first facets and adapted for attachment to an auxiliary chamber that is smaller than the processing chambers. A single third facet is attached to the bottom, where the single third facet is adapted for attachment to a load lock. A robot is attached to the bottom, the robot adapted to transfer substrates to and from the processing chamber, the auxiliary chamber, and the load lock.

In a further embodiment for a method of operating a substrate processing system that includes the components recited by the above system as well as a factory interface robot in the factory interface. The method includes transferring, by the factory interface robot, a substrate from the factory interface to the load lock. The method further includes transferring, by the transfer chamber robot, the substrate from the load lock to the first auxiliary chamber. The method further includes transferring, by the transfer chamber robot, the substrate from the first auxiliary chamber to the first processing chamber. The method further includes transferring, by the transfer chamber robot, the substrate from the first processing chamber to the load lock.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 1A-1B are top schematic views of an example processing tool according to various embodiments.

FIGS. 5A-5C are a top schematic view and side perspective views, respectively, of a processing tool in which the supporting components for the auxiliary chambers are positioned in particular locations according to an embodiment.

DETAILED DESCRIPTION OF EMBODIMENTS

Figure 1B:
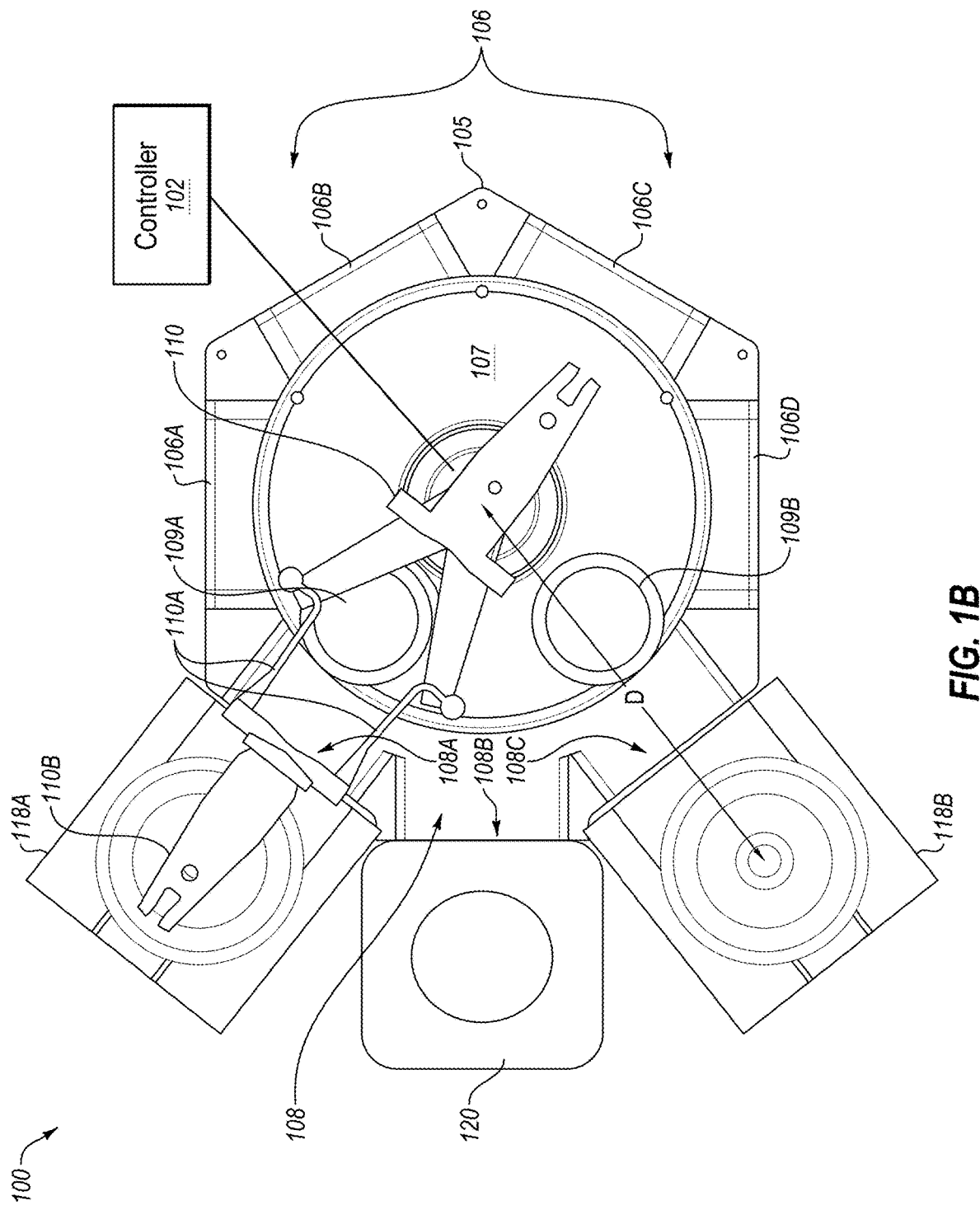

Embodiments described herein are related to systems and methods for semiconductor tool platform configuration with a reduced footprint. For example, to address the deficiencies noted above with relation to a large-sized footprint of a processing tool that includes two transfer chambers, the present disclosure adapts a single transfer chamber to attach to two auxiliary chambers (e.g., that can be a pre-clean chamber, a post-clean chamber, a degas chamber, a batch wafer storage, or a combination thereof) in addition to attaching to four processing chambers and a load lock. In some embodiments, the transfer chamber is designed with seven facets, four of which are larger and adapted to attach to the larger processing chambers, and three of which are smaller and designed to attach to the smaller auxiliary chambers and a load lock. In one embodiment, the four larger facets are sequentially positioned at a back end of the transfer chamber while the three smaller facets are sequentially positioned at a front end of the processing chamber. In one embodiment, the load lock is attached at a central one of the three smaller facets. The term "facet" herein can be considered synonymous with "side" of the transfer chamber.

In these and other embodiments, while the load lock can be a batch load lock attached to an atmospheric factory interface (FI), the load lock can also be attached to an FI that includes a controlled environment or atmosphere, e.g., sealed with an inert gas environment at a higher-than-atmospheric pressure or controlled with ultra-low moisture and/or ultra-low oxygen levels. In one embodiment, inert gas is circulated through the controlled environment to achieve ultra-low moisture and ultra-low oxygen environment. In another embodiment, extra clean dry air is circulated through the controlled environment to achieve an ultra-low moisture environment. In some embodiments, ultra-low moisture and ultra-low oxygen refers to 25% or lower than oxygen and moisture levels in ambient conditions (e.g., ¼ of the oxygen or moisture level in ambient air or less). In other embodiments, ultra-low moisture and ultra-low oxygen refers to 35% or lower than oxygen and moisture levels in ambient conditions.

The use of the FI that has a controlled environment can allow the use of a single-slot or a double-slot load lock. The single-slot load lock can allow a single wafer to be passed in either direction at the same time while the double-slot load lock can allow two wafers to be passed in opposite directions at the same time, e.g., an unprocessed wafer going into the transfer chamber and a processed wafer leaving the transfer chamber. In these embodiments, the batch load lock can be avoided due to the FI having a controlled environment, allowing free and efficient passage of processed and unprocessed wafers through the load lock without having to further pressurize the FI and prepare for transfer. Processed and unprocessed wafers can therefore be aggregated in a front end opening pod (FOUP) that can be attached and sealed to the FI.

In some embodiments, the square footage of the processing tool is reduced such that repackaging of some of the supporting components of the auxiliary chambers may be advisable. These supporting components can include, for example, a gas panel that supplies gas separately to the auxiliary chambers, associated gas lines, an alternating current (AC) power box, associated cables, and an electrical control box and associated interface. Embodiments of locating these supporting components will be discussed in more detail.

Advantages of embodiments of the present disclosure include, but are not limited to, increasing productivity per square footage of space of the processing tool, simplifying the load lock to a lower profile (which also saves space), and generally increasing wafer per hour per square feet (WPPS) being processed by about fifty percent or more. These and other advantages will be mentioned in the below disclosure and/or will be apparent to those of ordinary skill in the art of semiconductor device processing.

FIGS. 1A-1B are top schematic views of an example processing tool 100, e.g., semiconductor device processing system, according to various embodiments. In various embodiments, the processing tool 100 includes a single transfer chamber 105 having a number of facets, including at least seven facets attached between a bottom 107 and a top (not illustrated) of the transfer chamber 105.

In one embodiment, the transfer chamber 105, best illustrated in FIG. 1B, includes four first facets 106, where each of the four first facets 106 is adapted for attachment to a processing chamber, and three second facets 108, two of which are adapted for attachment to an auxiliary, and one of which is adapted for attachment to a load lock. In one embodiment, a middle of the three second facets 108 is sized and adapted to attach to the load lock. In various embodiments, each of the three second facets 108 has a width that is narrower than that of each of the four first facets 106. In other words, in these embodiments, each first facet has a width that is wider than that of each second facet. In some embodiments, the four first facets 106 are sequentially positioned along a back end of the transfer chamber 105 and the three second facets 108 are sequentially positioned along a front end of the transfer chamber.

The transfer chamber 105 can further include a transfer chamber robot 110 attached to the bottom 107 of the transfer chamber 105 approximately in a center of the bottom 107. The transfer chamber robot 110 can include one or more arms 110A with an end effector 110B attached to each arm 110A. Each end effector can be adapted to hold at least one substrate or wafer. The transfer chamber 105 can further include a first substrate support 109A and a second substrate support 109B. The transfer chamber robot 110 can set processed wafer down on either of the first and second substrate supports 109A and 109B for internal cooling within the transfer chamber 105 before being transferred out through the load lock.

In various embodiments, the processing tool 100 further includes one or more processing chambers 116A, 116B, 116C, 116D (also referred to as process chambers) attached to, respectively, the four first facets 106. For example, a first processing chamber 116A can be attached to a first facet 106A of the four first facets 106, a second processing chamber 116B can be attached to a second facet 106B of the four first facets 106, a third processing chamber 116C can be attached to a third facet 106C of the four first facets 106, and a fourth processing chamber 116D can be attached to a fourth facet 106D of the four first facets 106. The processing chambers 116A, 116B, 116C, 116D can include or more of etch chambers, deposition chambers (including atomic layer deposition, chemical vapor deposition, physical vapor deposition, or plasma enhanced versions thereof), anneal chambers, and the like. In one embodiment, each of the first, second, third, and fourth processing chambers is an epitaxial processing chamber.

In some embodiments, the processing tool 100 further includes a first auxiliary chamber 118A attached to a first facet 108A of the three second facets 108, a load lock 120 attached to a second facet 108B of the three second facets 108, and a second auxiliary chamber 118B attached to a third facet 108C of the three second facets 108. In various embodiments, each of the first auxiliary chamber 118A and the second auxiliary chamber 118B is a pre-clean chamber, a post-clean chamber, a degas chamber, or a batch wafer storage.

In various embodiments, a pre-clean chamber can be employed to prepare the surface of the wafers for processing within one of the processing chambers. For example, before depositing an epitaxial growth layer in an epitaxial processing chamber, a film on the wafers can be etched to particular pattern and surfaces otherwise cleaned of particles within a pre-clean chamber. Further, a post-clean can remove post-etch residues from wafers after having been etched in one of the processing chambers. Additionally, a degas chamber can be used for cleaning and drying a surface of wafers before undergoing plasma vapor deposition (PVD) type processing in one of the processing chambers. Also, wafers, whether processed or unprocessed, can be temporarily stored within a batch wafer storage before or after having been processed in a processing chamber or in between processing steps. In this way, the first and second auxiliary chamber 118A and 118B can be employed in a variety of ways in combination of these processes. Further, when an "auxiliary" chamber is referred to herein, reference can be inferred to be to any pre-clean chamber, post-clean chamber, degas chamber, batch wafer storage, or a combination thereof.

In various embodiments, the processing tool 100 further includes a factory interface (FI) 122 attached between a front end opening pod (FOUP) 130 and the load lock 120. While the load lock 120 can be attached to any of the three second facets 108, in one embodiment, the load lock 120 is attached to the second facet 108B of the three second facets 108, e.g., in between the first and second auxiliary chambers 118A and 118B. This can make the processing system 100 as compact as possible by angling the two auxiliary chambers, which are larger than the load lock 120, away from the FI 122. In various embodiments, the FI 122 further includes a factory interface (FI) robot 125 adapted to transfer substrate (wafers) to and from the FOUP 130 and the load lock 120. The wafers transferred to the load lock 120 can be unprocessed wafers and the wafers transferred back to the FOUP 130 can be processed wafers. In one embodiment, the load lock 120 is a batch load lock capable of holding many wafers.

In embodiments, the transfer chamber robot 110 is adapted to transfer substrates to and from the processing chambers 116A . . . 116D, one of the auxiliary chambers 118A and 118B, and the load lock 120. For example, the transfer chamber robot 110 can include an arm 110A and end effector 110B of a combined length sufficient to reach a substrate to a center of any attached processing chamber, to include the first processing chamber 116A, and also to the first auxiliary chamber 118A, and to the load lock 120.

In one embodiment, the FI 122 is an FI having a controlled environment, e.g., an environment of inert gas or of a combination of ultra-low moisture and/or ultra-low oxygen. In one embodiment, inert gas is circulated through the controlled environment to achieve ultra-low moisture and ultra-low oxygen environment. In another embodiment, extra clean dry air is circulated through the controlled environment to achieve an ultra-low moisture environment. The use of the FI 122 can allow use of a single-slot or a double-slot load lock for the load lock 120. The single-slot load lock can allow a single wafer to be passed in either direction at the same time while the double-slot load lock can allow two wafers to be passed in opposite directions at the same time, e.g., an unprocessed wafer going into the transfer chamber 105 and a processed wafer leaving the transfer chamber 105. In these embodiments, use of a larger profile batch load lock can be avoided due to the FI 122 with a controlled environment, allowing free and efficient passage of processed and unprocessed wafers through the load lock 120 without having to pressurize the FI 122 and prepare for transfer. Processed and unprocessed wafers can therefore be aggregated in the FOUP 130 that can be attached and sealed to the FI 122.

In some embodiments, to illustrate the small footprint, compact nature of the processing system 100, a distance (D) between a center of the robot 110 and a center of the one of the auxiliary chambers 118A or 118B is within 20% of 35 inches. The distance between the center of the robot 110 and a center of the load lock 120 can also be within 20% of 35 inches. Further, a width (W) of the processing tool 100, which can be an outer distance between two opposing processing chambers (e.g., 116A and 116D) can be within 20% of 140 inches. Additionally, a length of the processing tool 100, which can be between a front surface of the FI 122 and a back end of adjacent processing chambers (e.g., 116B and 116C) can be within 20% of 150 inches.

A controller 102 controls various aspects of the processing tool 100. The controller 102 can be and/or include a computing device such as a personal computer, a server computer, a programmable logic controller (PLC), a microcontroller, and so on. The controller 102 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. The controller 102 can include a data storage device (e.g., one or more disk drives and/or solid state drives), a main memory, a static memory, a network interface, and/or other components. The controller 102 can execute instructions to perform any one or more of the methodologies and/or embodiments described herein. The instructions can be stored on a computer readable storage medium, which can include the main memory, static memory, secondary storage and/or processing device (during execution of the instructions).

The controller 102 can receive signals from and send signals to the FI robot 125, the transfer chamber robot 110, the one or more processing chambers 116A . . . 116D, and the first and second auxiliary chambers 118A and 118B. The controller 102 can thus cause the control of these components within the processing tool 100 as will be discussed in more detail with reference to FIG. 6.

Figure 2:
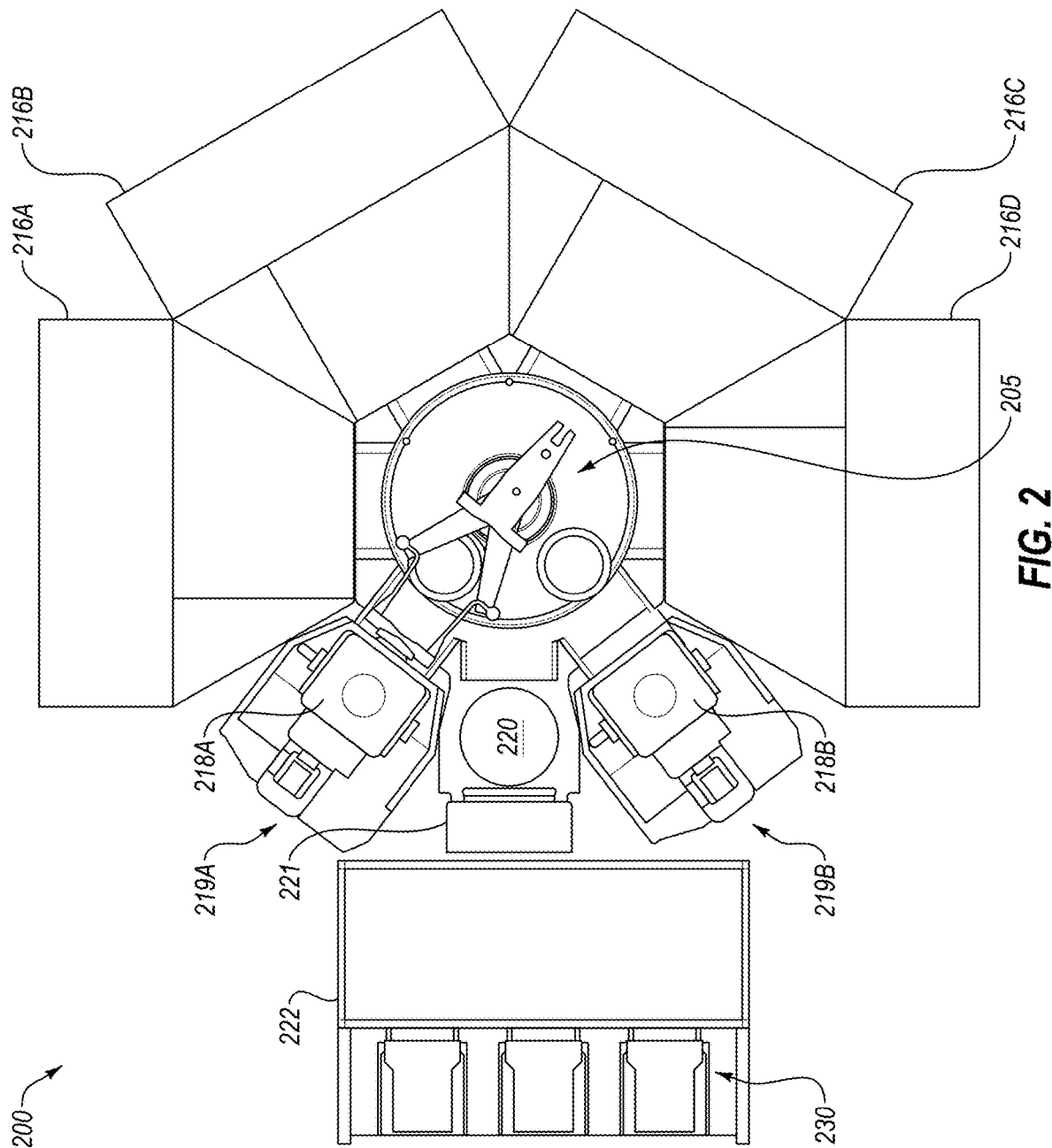
FIG. 2 is a top schematic view of another processing tool according to an embodiment.

FIG. 2 is a top schematic view of another processing tool 200 according to an embodiment. The processing tool 200 can be similar to the processing tool 100 of FIGS. 1A-1B, and thus not all components are labeled. For example, the processing tool 200 can include a transfer chamber 205 attached to multiple processing chambers 216A, 216B, 216C, and 216D and attached to a first auxiliary chamber 218A, a second auxiliary chamber 218B, and a load lock 220. Each of the first and second auxiliary chambers 218A and 218B can include a set of supporting components 219A and 219B, respectively, positioned at and below the first and second auxiliary chambers 218A and 218B. Each set of supporting components 219A and 219B can include, for example, gas lines, an AC power box, an electrical control box, power and electrical cables and the like.

In one embodiment, the processing tool 200 further includes an extension piece 221 attached between a load lock 220 and an FI 222, e.g., an FI 222 with a controlled environment. The extension piece 221 can help extend somewhat the attachment point to the FI 222 in order to make room for the set of supporting components 219A and 219B for each of the first and second auxiliary chambers 218A and 218B. In this embodiment, the an FI robot (not shown) can have an extended robot arm and/or end effector of the robot arm sufficient to place and retrieve substrates from a center of the load lock 220. The FI 222 can further be attached to a FOUP 230. Further, as illustrated, the load lock 220 can be attached off-center of the FI 222, where the exact location of attachment is not important. In this way, the FI 222 can be positioned to avoid the supporting components 219A and 219B and facilitate as compact a footprint as possible for the processing tool 200.

Figure 3:
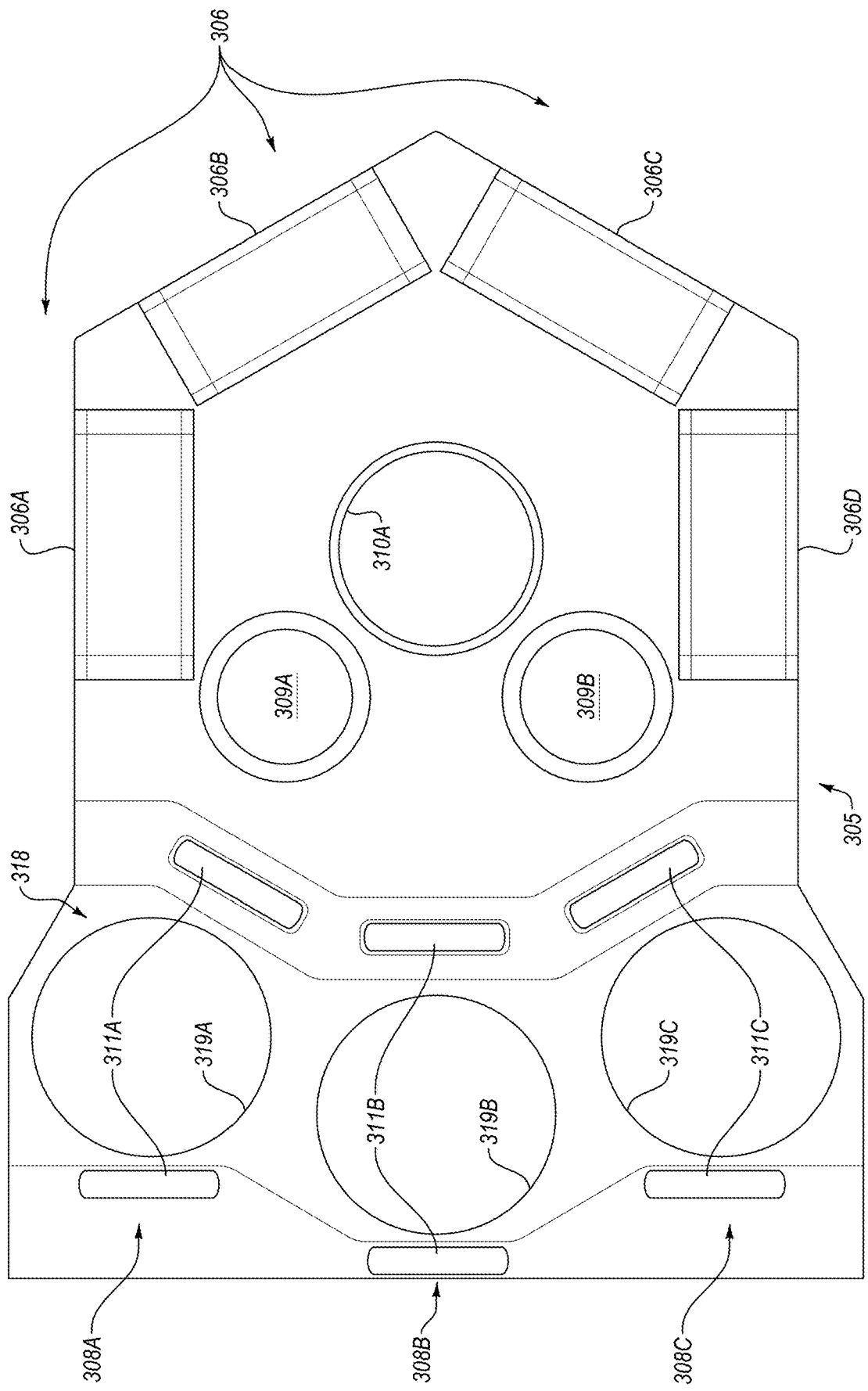
FIG. 3 is a top plane view of a transfer chamber according to an embodiment.

FIG. 3 is a top plane view of a transfer chamber 305 according to an embodiment. In some embodiments, the transfer chambers 105 and 205 can be replaced with the transfer chamber 305 of FIG. 3. In one embodiment, the transfer chamber 305 is made of an integral piece of metal, for example. The transfer chamber 305 can include four first facets 306, e.g., a first facet 306A, a second facet 306B, a third facet 306C, and a fourth facet 306D. Each of the these four first facets 306 is adapted for attachment to a processing chamber.

In some embodiments, the transfer chamber 305 further includes a transfer interface unit 318 adapted to include three facet portions, e.g., a first facet portion 308A, a second facet portion 308B, and a third facet portion 308C. Each of the facet portions is adapted for attachment to an auxiliary chamber or a load lock. For example, the first facet portion 308A can include a first pair of cylindrical locks 311A positioned on either side of a first orifice 319A, a second facet portions 308B can include a second a pair of cylindrical locks 311B positioned on either side of a second orifice 319B, and a third pair of cylindrical locks 311C positioned on either side of a third orifice 319C. In one embodiment, the transfer interface unit 318 is a solid, integral piece of metal or other material. In another embodiment, the transfer interface unit is a set of three strips of metal welded or otherwise attached together.

The transfer chamber 305 can further include a robot orifice 310A through which to attach a transfer chamber robot such as the transfer chamber robot 110 of FIG. 1B. The transfer chamber 305 can further include a first substrate support 309A and a second substrate support 309B, each on which to place a hot processed wafer after being withdrawn from a processing chamber. In epitaxial processing chambers, the temperature can reach in excess of 800° C. Thus, the first and second substrate supports 309A and 309B can be used to temporarily rest (e.g., up to 20-30 minutes) the processed wafers before transferring the processed wafers to the load lock.

Figure 4A:
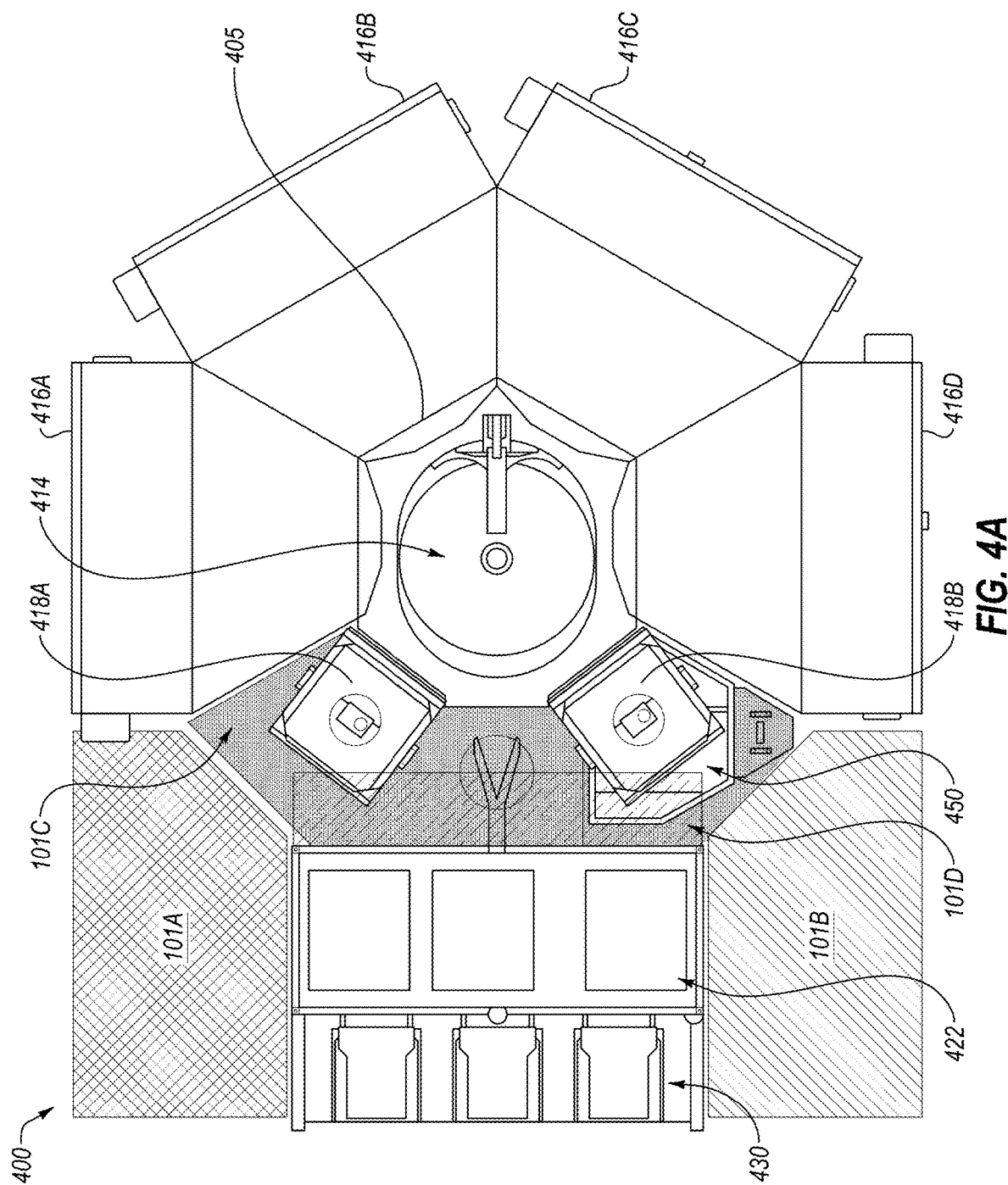
FIGS. 4A-4B are top and side schematic views, respectively, of a processing tool that illustrates multiple potential areas for location of supporting components for auxiliary chambers according to various embodiments.
Figure 4B:
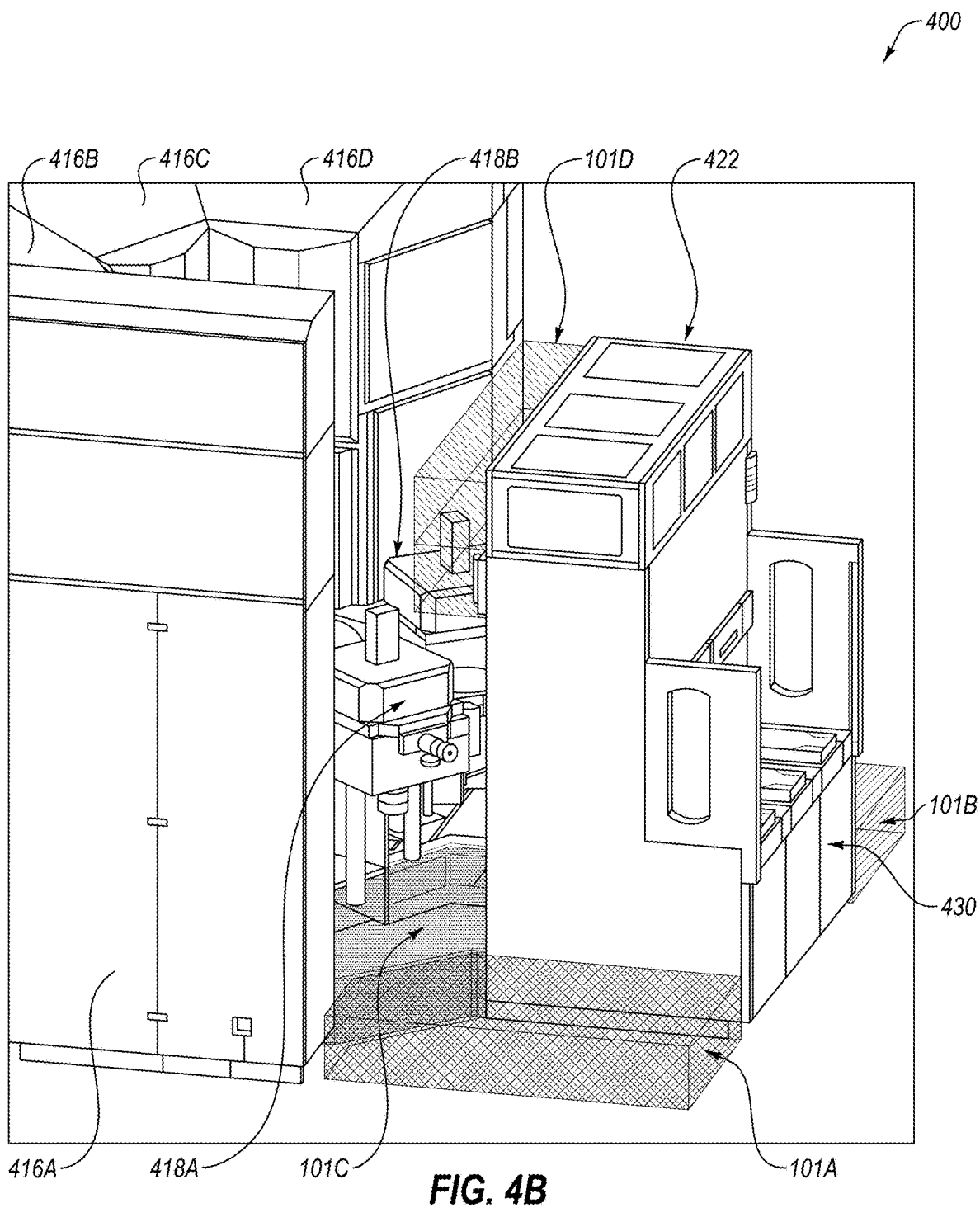

FIGS. 4A-4B are top and side schematic views, respectively, of a processing tool 400 that illustrates multiple potential areas for location of supporting components for auxiliary chambers according to various embodiments, e.g., within a first area 101A, a second area 101B, a third area 101C, or a fourth area 101D. In some embodiments, the processing tool 400 is the same or similar processing tool of FIGS. 1A-1B and FIG. 2.

For example, in various embodiments, the processing tool 400 can include a transfer chamber 405 attached to multiple processing chambers 416A, 416B, 416C and 416D, to a first auxiliary chamber 418A, to a load lock (not shown), and to a second auxiliary chamber 418B. The transfer chamber 405 can further include a top 414 that is attached to the seven facets, e.g., which can be attached to a bottom such as the bottom 107 illustrated in FIGS. 1A-1B. The processing tool 400 can further include an FI 422 attached to a load lock (not shown) that is further attached to the transfer chamber 405. In some embodiments, the FI 422 is an FI with a controlled environment, as discussed previously, and is attached to a FOUP 430.

The supporting components to be located in one of the possible areas can include, for example, a gas panel that supplies gas separately to the first and second auxiliary chambers 418A and 418B, associated gas lines, an alternating current (AC) power box, associated cables, and an electrical control box and associated interface. Embodiments of locating these supporting components will be discussed in more detail. A gas panel 450 is illustrated by way of example located below the second auxiliary chamber 418B, but can be located in any of the first area 101A, the second area 101B, the third area 101C, or the fourth area 101D. The gas panel 450 can also be located one of adjacent to or above a respective auxiliary chamber, such as above or adjacent to the first auxiliary chamber 418A. The gas panel 450 can be adapted to supply select one or more gases (e.g., can be a mixture of gases) and feed the processing gas(es) to the first and second auxiliary chambers 418A and 418B.

In some embodiments, the first area 101A is located adjacent a first side of the FI 422 and in an associated space between the FI 422 and a first processing chamber 416A. The second area 101B can further be located adjacent a second side of the FI 422 and in an associated space between the FI 422 and a fourth processing chamber 416D. The third area 101C can be located below the first auxiliary chamber 418A and below the second auxiliary chamber 418B where the gas panel 450 is located. In addition to locating supporting components, the third area 101C can also be adapted to include a service access area for providing access to the transfer chamber 405 to conduct service on the transfer chamber 405. The service access area, more specifically, can be located between at least one of the first auxiliary chamber 418A and the second auxiliary chamber 418B and the floor. In some embodiments, the service access area with the third area 101C passes between the first auxiliary chamber 418A and the second auxiliary chamber 418B and over an electrical panel box for the transfer chamber 405 that is generally located below the load lock. The fourth area 101D can be an area of attachment to an upper back face of the FI 422, e.g., that least partially overhangs the load lock and one or both of the first and second auxiliary chambers 418A and 418B.

Figure 5B:
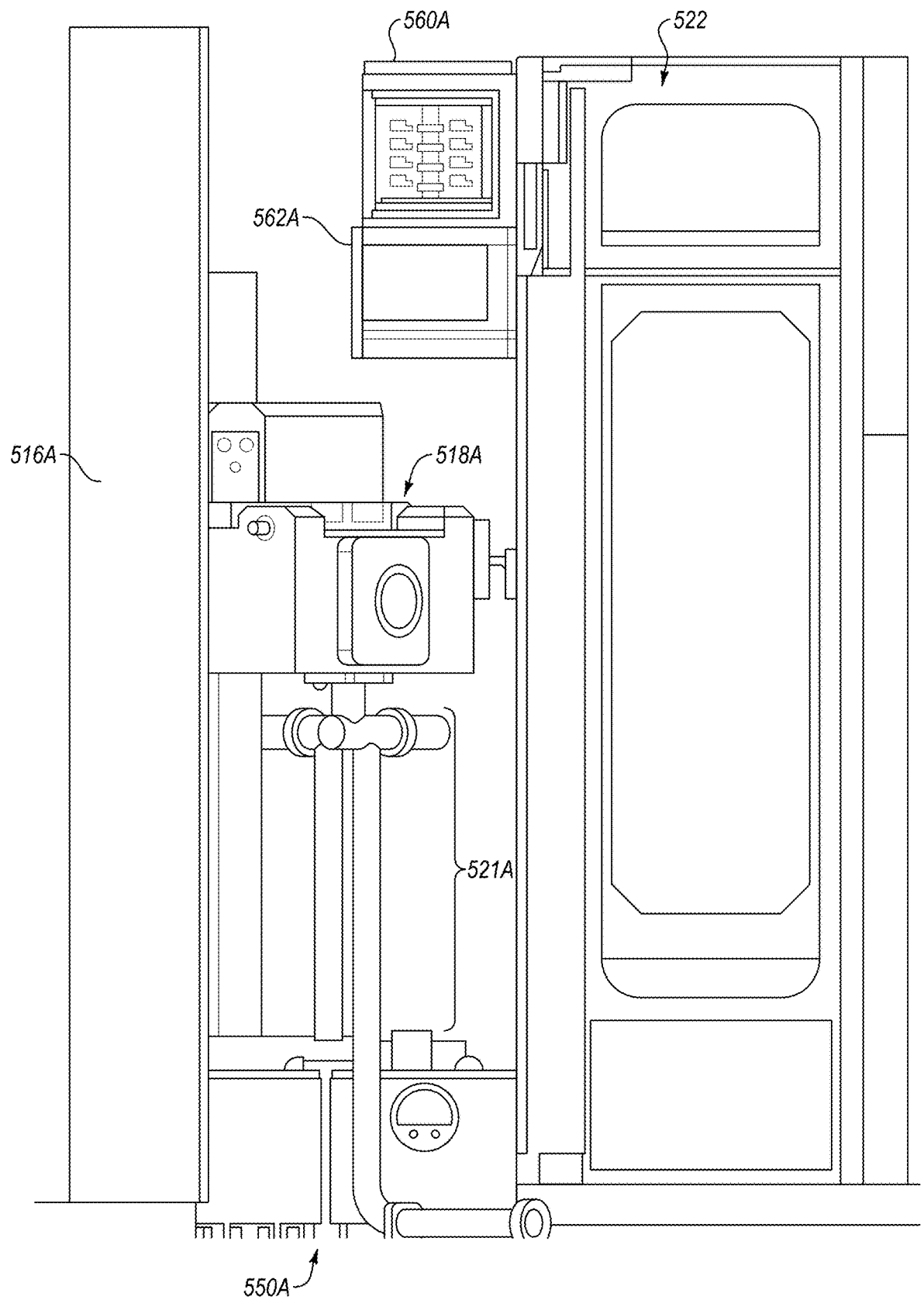
Figure 5C:
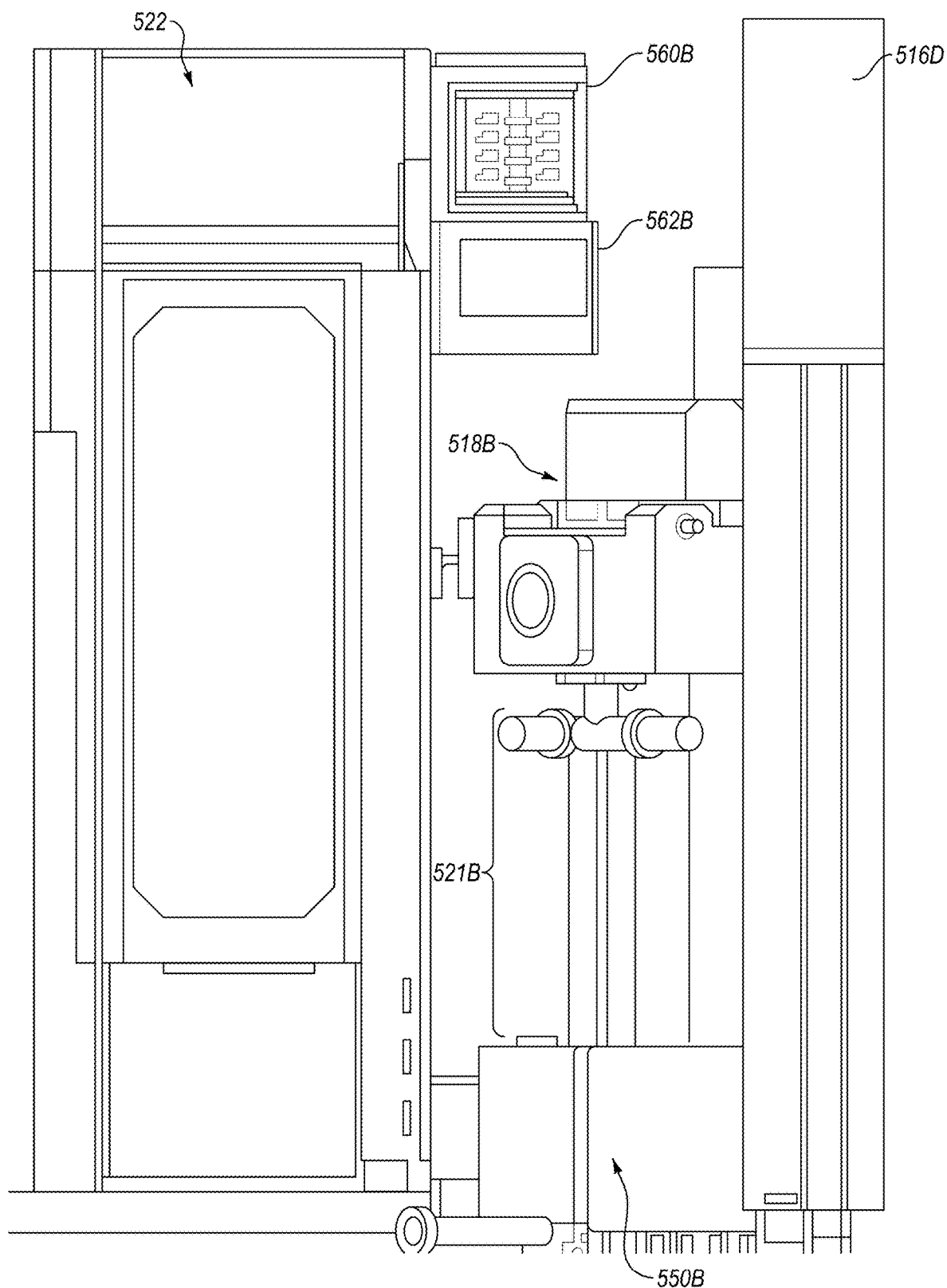

FIGS. 5A-5C are a top schematic view and side perspective views, respectively, of a processing tool 500 in which the supporting components for the auxiliary chambers are positioned in particular locations according to an embodiment. For example, in various embodiments, the processing tool 500 can include a transfer chamber 505 attached to multiple processing chambers 516A, 516B, 516C and 516D, to a first auxiliary chamber 518A, to a load lock 520, and to a second auxiliary chamber 518B. The transfer chamber 505 can further include a top 514 that is attached to the seven facets, e.g., which can be attached to a bottom such as the bottom 107 illustrated in FIGS. 1A-1B. The processing tool 500 can further include an FI 522 attached to the load lock 520 that is further attached to the transfer chamber 505. In some embodiments, the FI is an FI with a controlled environment, as discussed previously, and is attached to a FOUP 530.

In some embodiments, a gas panel (such as a first gas panel 550A) for the first and second auxiliary chambers 518A and 518B is positioned between one of the first and second auxiliary chambers 118A and 118B and a floor of the processing tool 500. The processing tool 500 can further include gas lines (such as one or more first gas lines 521A) that run between the gas panel 550A and each of the first and second auxiliary chambers 518A and 518B. In one embodiment, the first gas panel 550A is positioned between the first auxiliary chamber 518A and the floor and the one or more first gas lines 521A are connected between the first gas panel 550A and a first auxiliary chamber 518A to feed processing gases to the first auxiliary chamber 518A from the first gas panel 550A. In a further embodiment, a second gas panel 550B is positioned between the second auxiliary chamber 518B and the floor and one or more second gas lines 521B are connected between the second gas panel 550B and the second auxiliary chamber 518B to feed processing gases to the second auxiliary chamber 518B from the second gas panel 550B.

Further, in one embodiment, the first auxiliary chamber 518A is attached to the transfer chamber 505 adjacent to a first side of the load lock 520. The processing tool 500 can further include an alternating current (AC) power box 560A to power the first auxiliary chamber 518A. The AC power box 560A can be attached to a first side of an upper back face of the factory interface, e.g., the FI 522. AC cables attached to the AC power box 560A being run along an outside of the FI 522 and over to the first auxiliary chamber 518A. The processing tool 500 can further include an electrical control box 562A to control functioning of the first auxiliary chamber 518A. The electrical control box 562A can be attached to the first side of the upper back face of the factory interface and adjacent to the AC power box 560A, e.g., below the AC power box 560A in one embodiment. In one embodiment, the AC power box 560A is at least partially hanging over the first auxiliary chamber 518A.

In an alternative embodiment, the AC power box 560A is optionally located adjacent to a first processing chamber 516A, e.g., on the floor next to the first processing chamber 516A. The electrical control box 562A can then be attached to the AC power box 560A, e.g., on top of, below, or next to the electrical control box 562A. Further, one or more first AC cables 564A can be attached to the AC power box 560A and run between the AC power box 560A and the first auxiliary chamber 518A. In some embodiments, the one or more first AC cables 564A includes cable(s) for the electrical control box 562A as well.

Further, in one embodiment, the second auxiliary chamber 518A is attached to the transfer chamber 505 adjacent to a second side of the load lock 520. The processing tool 500 can further include an alternating current (AC) power box 560B to power the second auxiliary chamber 518B. The AC power box 560B can be attached to a second side of an upper back face of the factory interface, e.g., the FI 522. AC cables attached to the AC power box 560B being run along an outside of the FI 522 and over to the second auxiliary chamber 518B. The processing tool 500 can further include an electrical control box 562B to control functioning of the second auxiliary chamber 518B. The electrical control box 562B can be attached to the second side of the upper back face of the FI 522 and adjacent to the AC power box 560B, e.g., below the AC power box 560B in one embodiment. In one embodiment, the AC power box 560B is at least partially hanging over the second auxiliary chamber 518B.

In an alternative embodiment, the AC power box 560B is optionally located adjacent to a fourth processing chamber 516D, e.g., on the floor next to the fourth processing chamber 516D. The electrical control box 562B can then be attached to the AC power box 560B, e.g., on top of, below, or next to the electrical control box 562B. Further, one or more second AC cables 564B can be attached to the AC power box 560B and run between the AC power box 560B and the second auxiliary chamber 518B. In some embodiments, the one or more second AC cables 564A includes cable(s) for the electrical control box 562B as well.

Figure 6:
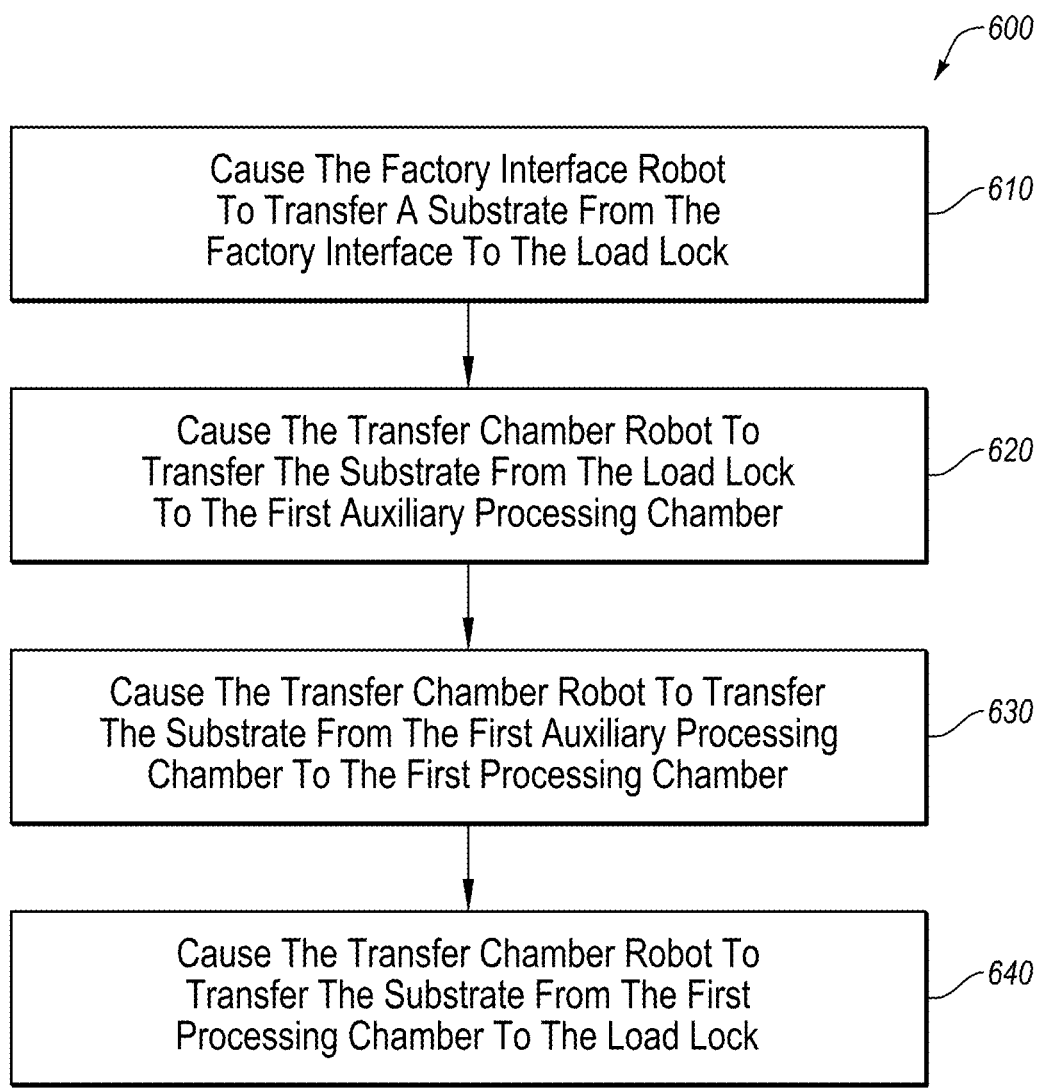
FIG. 6 is a flow chart of a method of operating the disclosed processing tools according to various embodiments.

FIG. 6 is a flow chart of a method 600 of operating the disclosed processing tools according to various embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the controller 102 (FIG. 1) or other computing system having a processing device and with reference to any of the processing tools described herein. Although shown in a particular sequence or order, unless otherwise specified, the order of the processes can be modified. Thus, the illustrated embodiments should be understood as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic causes the factory interface robot to transfer a substrate from the factory interface to the load lock.

At operation 620, the processing logic causes the transfer chamber robot to transfer the substrate from the load lock to the first auxiliary chamber.

At operation 630, the processing logic causes the transfer chamber robot to transfer the substrate from the first auxiliary chamber to the first processing chamber.

At operation 640, the processing logic causes the transfer chamber robot to transfer the substrate from the first processing chamber to the load lock.

In extensions to the embodiment of FIG. 6, the processing logic can further cause the transfer chamber robot to transfer the substrate to a substrate support of the transfer chamber for cooling before transferring the substrate to the load lock. The processing logic can further cause the factory interface robot to transfer the substrate from the load lock to a front opening unified pods attached to the factory interface.

In extensions to the embodiment of FIG. 6, the processing logic can further cause the substrate to be processed by the first auxiliary chamber to remove a pattern of a film pre-deposited on the substrate and to clean a surface of the substrate. The processing logic can further cause the substrate to be processed by the first processing chamber to perform epitaxial growth of a crystalline film deposited on the substrate.

The preceding description sets forth numerous specific details such as examples of specific systems, components, methods, and so forth in order to provide a good understanding of several embodiments of the present disclosure.

It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate processing system comprising:
   a factory interface having a controlled environment;
   a transfer chamber of heptagonal shape and comprising:
      four first facets; and
      three second facets, wherein each of the three second facets has a width that is narrower than that of each of the four first facets;
   a first processing chamber attached to one of the four first facets;
   a first auxiliary chamber attached to a first of the three second facets, wherein the first auxiliary chamber is smaller than the first processing chamber;
   a load lock attached to a second of the three second facets and to the factory interface; and
   a robot attached to a bottom of the transfer chamber, the robot adapted to transfer substrates to and from the first processing chamber, the first auxiliary chamber, and the load lock, wherein a distance between a center of the robot and a center of one of the first auxiliary chamber is within 20% of 35 inches.

2. The substrate processing system of claim 1, wherein the first processing chamber is an epitaxial processing chamber, and wherein the controlled environment is an environment of ultra-low oxygen and ultra-low moisture comprising 25% or lower than oxygen and moisture levels in ambient conditions.

3. The substrate processing system of claim 1, wherein the controlled environment is an inert gas environment.

4. The substrate processing system of claim 1, further comprising:
   a gas panel positioned one of adjacent to or above the first auxiliary chamber; and
   one or more gas lines connected between the gas panel and the first auxiliary chamber to feed processing gases to the first auxiliary chamber from the gas panel.

5. The substrate processing system of claim 1, further comprising a second auxiliary chamber attached to a third of the three second facets, wherein the load lock is attached to the transfer chamber between the first and second auxiliary chambers.

6. The substrate processing system of claim 5, wherein at least one of the first auxiliary chamber or the second auxiliary chamber comprises a pre-clean chamber, a post-clean chamber, a degas chamber, or a batch wafer storage.

7. The substrate processing system of claim 5, further comprising a gas panel positioned between one of the first and second auxiliary chambers and a floor of the substrate processing system, the gas panel to feed processing gases to the first and second auxiliary chambers.

8. The substrate processing system of claim 5, wherein the four first facets are sequentially positioned along a back end of the transfer chamber opposite from a front end where the load lock is attached, and further comprising:
   a second processing chamber attached to a second of the four first facets;
   a third processing chamber attached to a third of the four first facets; and
   a fourth processing chamber attached to a fourth of the four first facets.

9. The substrate processing system of claim 1, wherein the load lock is one of a batch load lock, a single-slot, or a double-slot load lock.

10. The substrate processing system of claim 1, further comprising three additional processing chambers attached to three of the four first facets, wherein an outer distance between two opposing processing chambers is within 20% of 140 inches, and a length between a front surface of the factory interface and a back end of adjacent processing chambers is within 20% of 150 inches.

11. The substrate processing system of claim 1, wherein the robot comprises an arm and end effector of a combined length sufficient to reach a substrate to a center of the first processing chamber, the first auxiliary chamber, and the load lock.

12. The substrate processing system of claim 1, wherein the first auxiliary chamber is attached to the transfer chamber adjacent to a first side of the load lock, and further comprising:
   an alternating current (AC) power box to power the first auxiliary chamber, the AC power box located adjacent to the first processing chamber;
   an electrical control box to control functioning of the first auxiliary chamber, wherein the electrical control box is attached to the AC power box; and
   AC cables attached to the AC power box being run between the AC power box and the first auxiliary chamber.

13. A method of operating a substrate processing system comprising a factory interface having a controlled environment and a factory interface robot; a transfer chamber of heptagonal shape and comprising four first facets and three second facets, where each of the three second facets has a width that is narrower than that of each of the four first facets; a first processing chamber attached to a first of the four first facets; a first auxiliary chamber attached to a first of the three second facets; a load lock attached to a second of the three second facets and to the factory interface; and a transfer chamber robot attached to a bottom of the transfer chamber, wherein a distance between a center of the robot and a center of one of the first auxiliary chamber is within 20% of 35 inches, the method comprising:

causing the factory interface robot to transfer a substrate from the factory interface to the load lock;

causing the transfer chamber robot to transfer the substrate from the load lock to the first auxiliary chamber;

causing the transfer chamber robot to transfer the substrate from the first auxiliary chamber to the first processing chamber; and causing the transfer chamber robot to transfer the substrate from the first processing chamber to the load lock.

14. The method of claim 13, further comprising:

causing the transfer chamber robot to transfer the substrate to a substrate support of the transfer chamber for cooling before transferring the substrate to the load lock; and causing the factory interface robot to transfer the substrate from the load lock to a front opening unified pods attached to the factory interface.

15. The method of claim 13, further comprising:

causing the substrate to be processed by the first auxiliary chamber to remove a pattern of a film pre-deposited on the substrate and to clean a surface of the substrate; and causing the substrate to be processed by the first processing chamber to perform epitaxial growth of a crystalline film deposited on the substrate.

\* \* \* \* \*